United States Patent [19]
Podgorski

[11] Patent Number: 6,075,495
[45] Date of Patent: Jun. 13, 2000

[54] BROADBAND TEM-HORN ANTENNA

[76] Inventor: Andrew S. Podgorski, 332 Crestview Road, Ottawa, Ontario, Canada, K1H 5G6

[21] Appl. No.: 09/043,400

[22] PCT Filed: Sep. 26, 1996

[86] PCT No.: PCT/CA96/00646

§ 371 Date: Mar. 24, 1998

§ 102(e) Date: Mar. 24, 1998

[87] PCT Pub. No.: WO97/12252

PCT Pub. Date: Apr. 3, 1997

Related U.S. Application Data

[60] Provisional application No. 60/006,306, Nov. 7, 1995.

[30] Foreign Application Priority Data

Jun. 21, 1996 [CA] Canada ................................. 2179703

[51] Int. Cl.[7] .............................................. H01Q 13/00
[52] U.S. Cl. ............................................ 343/786; 343/776
[58] Field of Search .................................... 343/786, 783, 343/785, 772, 776, 784

[56] References Cited

U.S. PATENT DOCUMENTS 3,611,396  10/1971  Jones, Jr. ............................... 343/776
4,546,358  10/1985  Edlin et al. ............................. 343/703
4,571,593   2/1986  Martinson .............................. 343/783
4,811,028   3/1989  Bryanos ................................. 343/786
5,440,316   8/1995  Podgorski et al. ..................... 343/786

FOREIGN PATENT DOCUMENTS

4200778A1   7/1994  Germany .
WO 93/03387  2/1993  WIPO .

*Primary Examiner*—David H. Vu
*Assistant Examiner*—James Clinger
*Attorney, Agent, or Firm*—Jones, Tullar & Cooper, PC

[57] ABSTRACT

This application relates to a compact broadband horn antenna. The antenna has a septum in the horn adjacent one side thereof. One embodiment consists of abutting, wedge-shaped, dielectric members having conducting coatings. A particular feed arrangement has a primary segment partitioned into quadrants with each quadrant having a conducting septum extending forwardly into a secondary section, to provide field uniformity. In an embodiment useful at frequencies above 1 GHz the septum curves upwardly at the horn mouth and is supported by an absorbing structure located just above the mouth of the horn. The other end of the septum is supported at the horn feed and the septum is otherwise unsupported along its length.

14 Claims, 12 Drawing Sheets

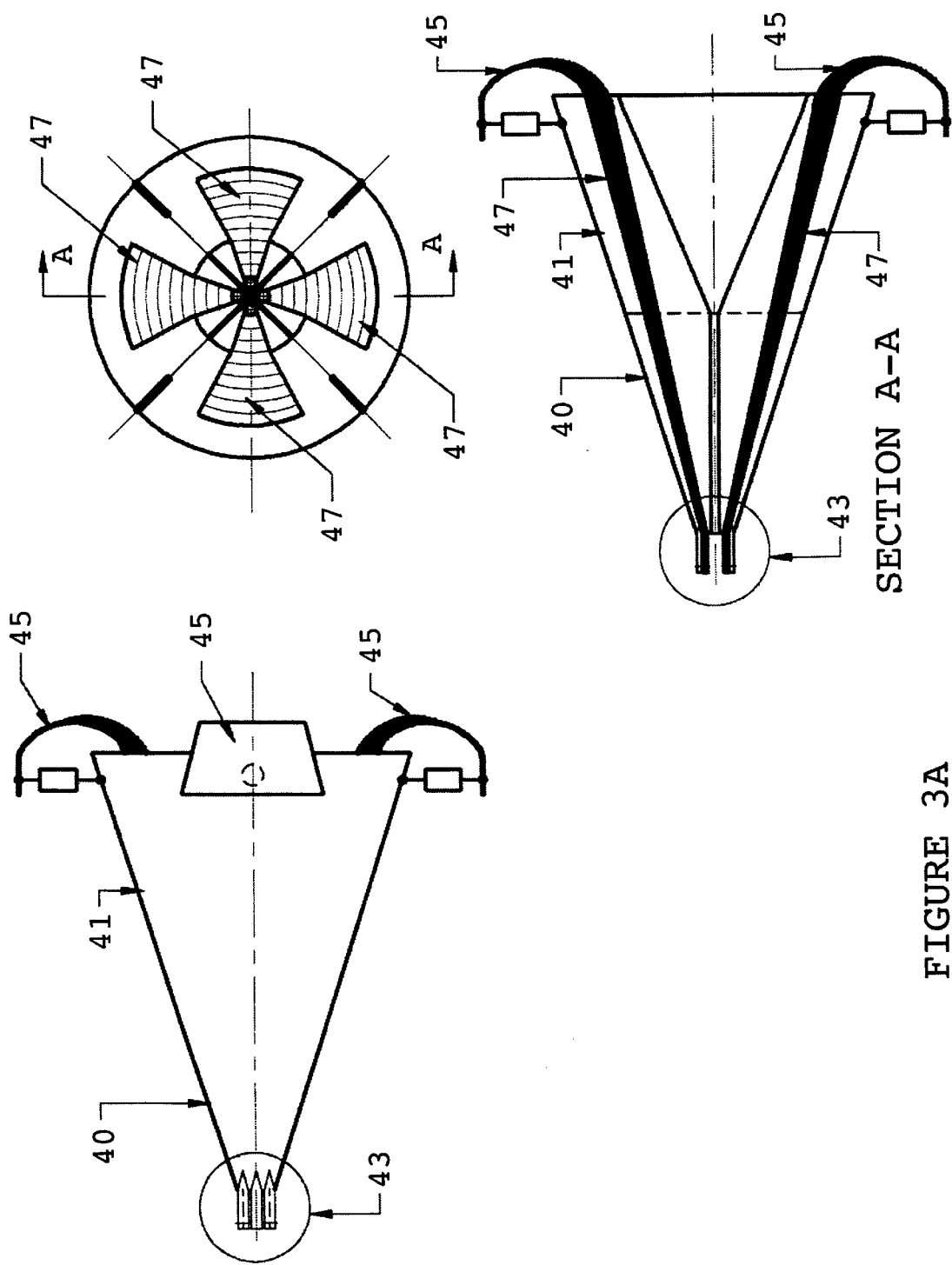

BROADBAND TEM-HORN ANTENNA

This Application claims benefit of Provisional application Ser. No. 60/006,306 Nov. 7, 1995.

This invention relates to compact broadband TEM-horn antennas capable of multi-octave bandwidth and narrow beam operation for communication and high field applications at low, medium and high power levels.

Applicant's PCT application WO 93/03387, published Feb. 18, 1993 teaches a broadband antenna having a similar basic structure.

Some versions of the improved antenna of this application operate at a significantly higher frequency range due to the lack of internal obstructions arising from an unsupported septum and various regions of absorbent material positioned at the mouth of the horn and around the septum.

FIG. 1 is a perspective view of one embodiment of the antenna of this invention;

FIGS. 1A and 1B show different forms of coupling to the antenna;

FIG. 2 shows an exploded view of another embodiment of the antenna of this invention;

FIG. 3 shows a perspective view of another embodiment of the invention;

FIG. 3A shows sectional views of the antenna of FIG. 3;

FIG. 3B shows a side view of the antenna of FIG. 3;

FIG. 4 shows a signal feed arrangement for the antenna of FIG. 3;

FIG. 5 shows a perspective view of another embodiment of broadband TEM-horn antenna capable of multi-octave bandwidth and narrow beam operation at frequencies higher than 1 GHz for communication, Electronic Warfare and EMC testing applications at low and medium power levels;

FIG. 6 shows the perspective view of the broadband TEM-horn antenna of FIG. 5 with one of the horn antenna walls removed in order to show the septum and horn absorbers;

FIG. 7 shows a cut through the perspective view of the broadband TEM-horn antenna of FIG. 5;

FIG. 8 shows a perspective view of another embodiment of the broadband TEM-horn antenna capable of multi-octave bandwidth and narrow beam operation at frequencies higher than 1 GHz for communication, Electronic Warfare and EMC testing applications at high power levels;

FIG. 9 shows a perspective view of the broadband TEM-horn antenna of FIG. 8 with one of the horn antenna walls removed in order to show the septum and horn absorbers; and FIG. 10 shows a cut through the perspective view of the broadband TEM-horn antenna of FIG. 8.

FIG. 1 shows an antenna in accordance with the invention consisting of a rectangular horn containing a conducting septum that is located off the geometrical center of the horn. The horn is loaded with dielectric material which at the horn aperture is shaped to form a lens. A pair of forwardly extending plates (septum extension and ground extension) provides a low frequency radiating arrangement and appropriate low frequency termination of the septum. To assure broadband operation of the antenna, the input signals are supplied through striplines or coaxial lines.

Specifically, the antenna consists of two abutting wedge-shaped dielectric members 10 and 11. The side and outer surfaces of each dielectric member are metallized as shown at 12. Member 11 has a wedge angle 13 greater than the wedge angle 14 of member 10. At least one of the abutting inner surfaces of the wedge-shaped members is metallized to form an isolated conductor 15, spaced from the side walls of the horn and functioning as a conducting septum. Due to the unequal wedge angles of members 10 and 11 the septum is asymmetrically positioned in the horn. The curved front surfaces of members 10 and 11 cooperate to provide a lens element to form the horn output into a parallel beam.

A downwardly curved conducting member 16 extends forwardly from the end of the lower conducting surface of the horn and a similar but upwardly curved conducting member 17 extends forwardly from the end of the septum. Terminating resistors 18 connect the free end of member 17 to the upper conducting surface of the horn.

FIGS. 1A and 1B show alternative structures for connecting power to the antenna. In FIG. 1A a stripline 20 is positioned with one conductor connected to an outer conducting surface of the horn and the other conductor connected to the septum 15. In FIG. 1B a coaxial line 21 has its central conductor connected to the septum 15 and the outer conductor connected to the outer conducting surface of the horn.

In another embodiment useful for communication at low and medium power levels the antenna can be incorporated into a printed circuit board substrate to provide the septum and the active elements to supply the signal to be transmitted.

FIG. 2 shows the antenna as before formed from two wedge-shaped dielectric members coated on their outer surfaces with conductive material. The dielectric members are sandwiched with a printed circuit board. A pair of forwardly extending plates (septum extension and ground extension) provides a low frequency radiating arrangement and for appropriate low frequency termination of the septum.

Specifically, upper and lower wedge-shaped dielectric members 30 and 31 can be attached by any suitable means, such as epoxy bonding, to opposite sides of a printed circuit board 32. Board 32 contains, in addition to active elements (not shown) a conducting plane 33 which functions as a septum in the antenna. The front surfaces 34*a* and 34*b* of members 30 and 31 are curved to cooperate in forming a lens member ensuring that radiation from the antenna is a parallel beam.

A curved conducting extension 35 is connected to and extends upwardly from the end of the septum and is connected to the conducting upper surface of the horn by terminating resistors 36. A further curved, conducting extension 37 is connected to and extends downwardly from the conducting lower surface of the horn.

FIG. 3 shows another embodiment of the antenna. The overall shape of the horn is conical and it consists of a primary section 40 merging into a secondary section 41. Section 40 is divided into four symmetrical quadrants by interior conducting walls 42. Within each quadrant a conducting conical sector spaced from the outer wall, and spaced from the interior conducting walls, functions as a septum. Throughout the primary section the quadrants are electrically separated from one another and a separate signal feed 43, shown in more detail in FIG. 4, is provided for each quadrant.

Section 41 functions to integrate the field components provided by the individual quadrants of section 40. On entering section 41 the septums of each quadrant continue in the same direction and with the same expansion, as shown in fragmentary view at 47. The dividing walls 44 separate to become relatively shorter partitions extending inwardly around the circumference of the horn.

As best shown in FIG. 3A, each septum terminates in an outwardly and rearwardly curved extension 45, in turn connected to the conducting outer surface of the horn by matching resistors.

Figure 1:
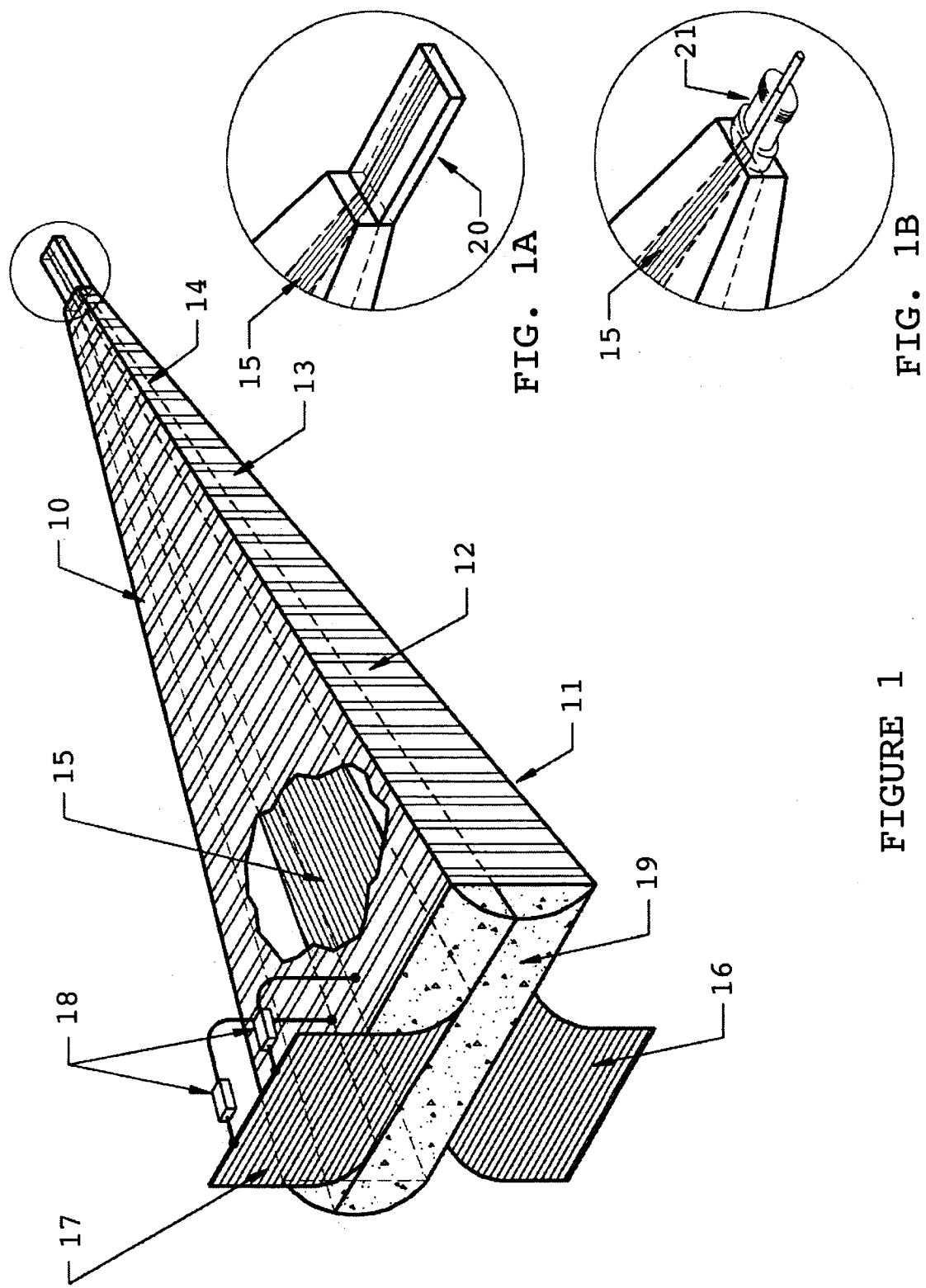
Figure 2:
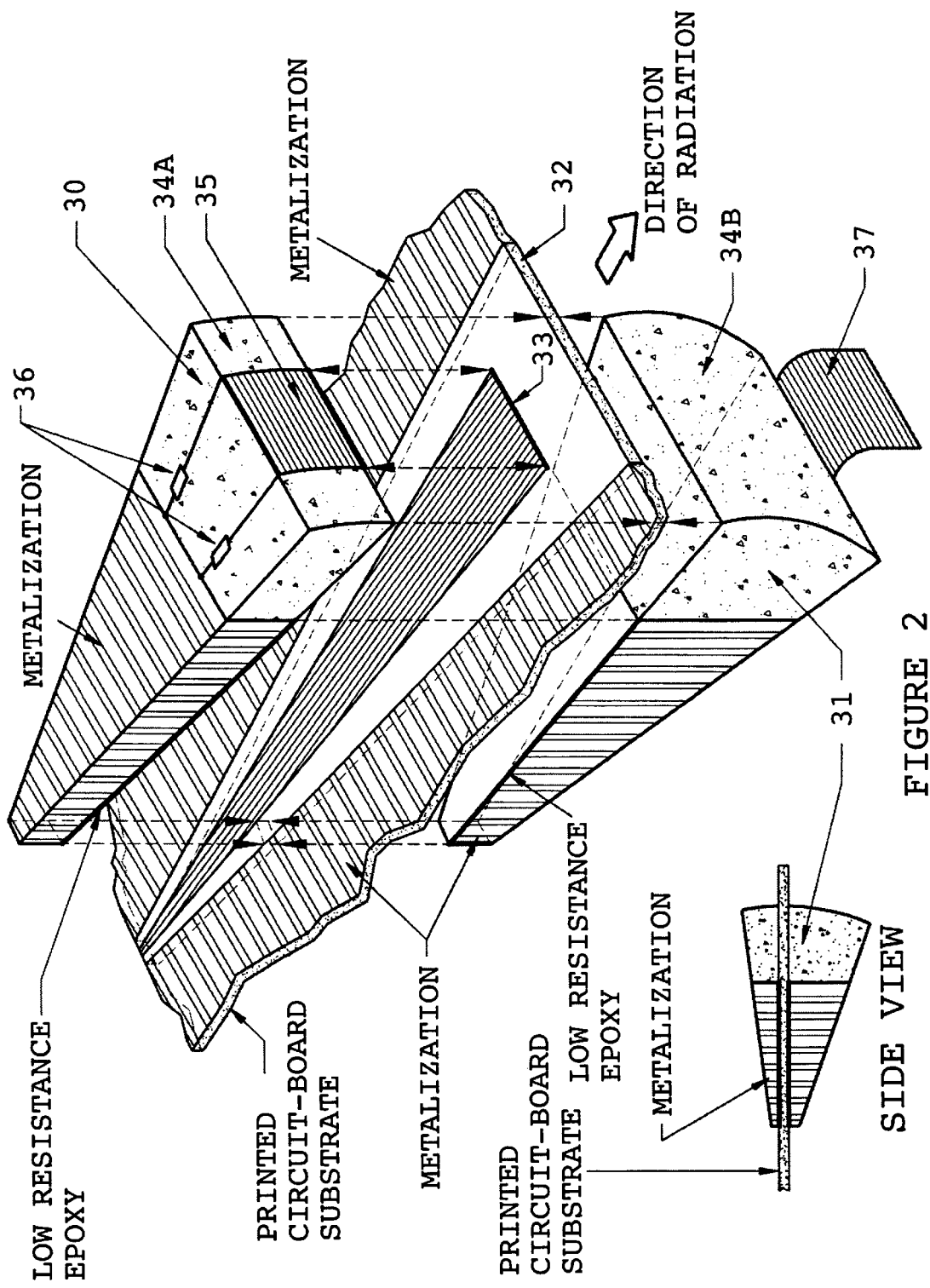
Figure 3:
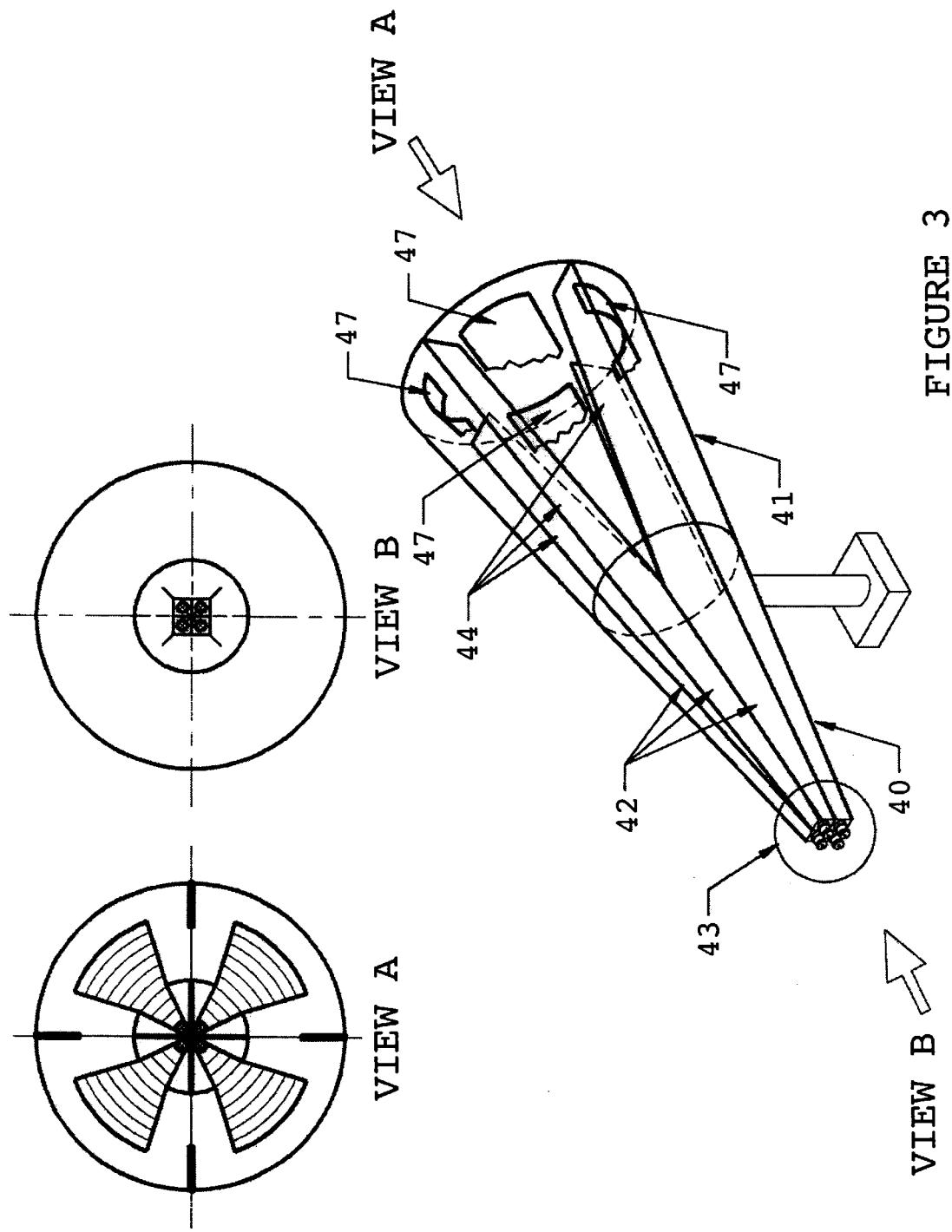
Figure 3B:
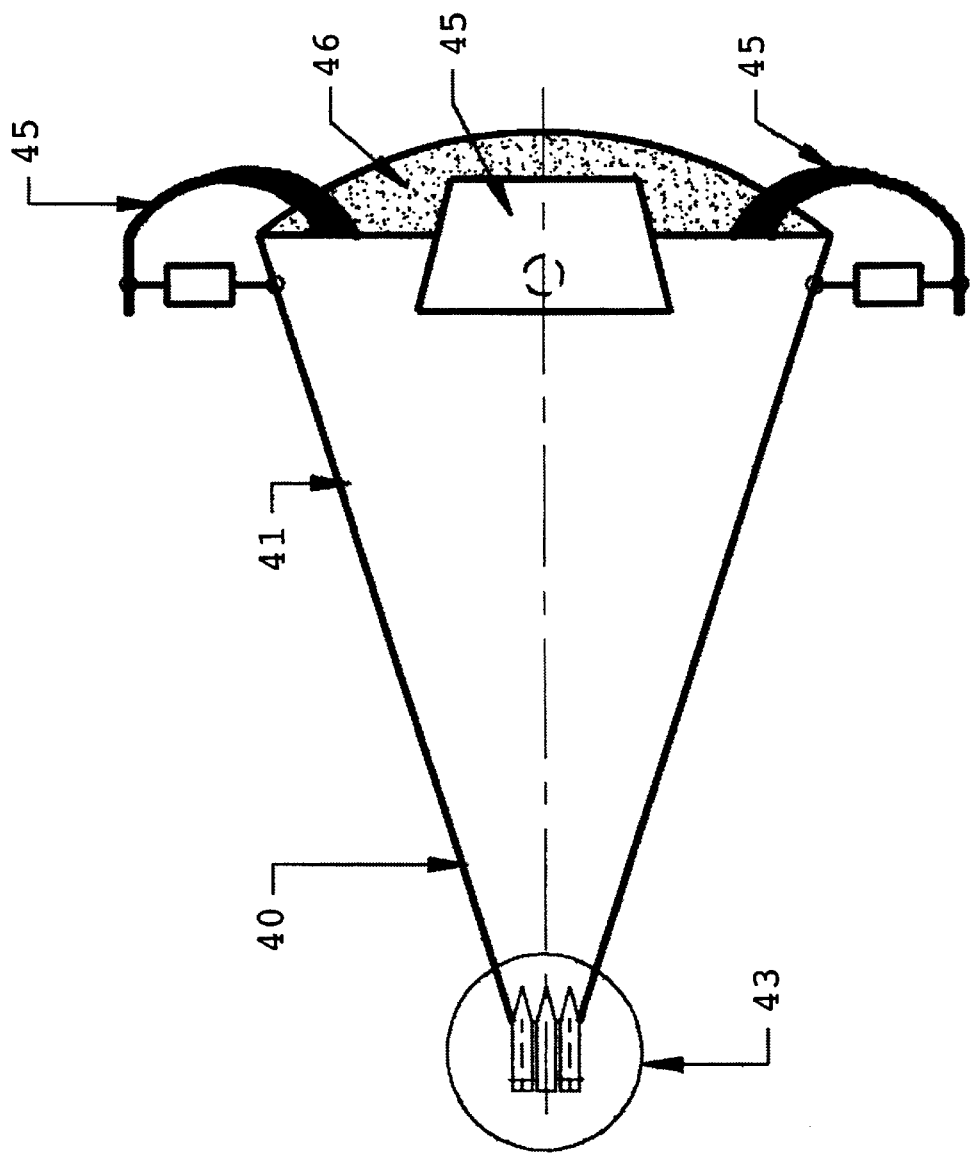

The complete antenna can be filled with dielectric material shaped to form a lens 46 at the horn opening, as shown in FIG. 3B.

Figure 4:
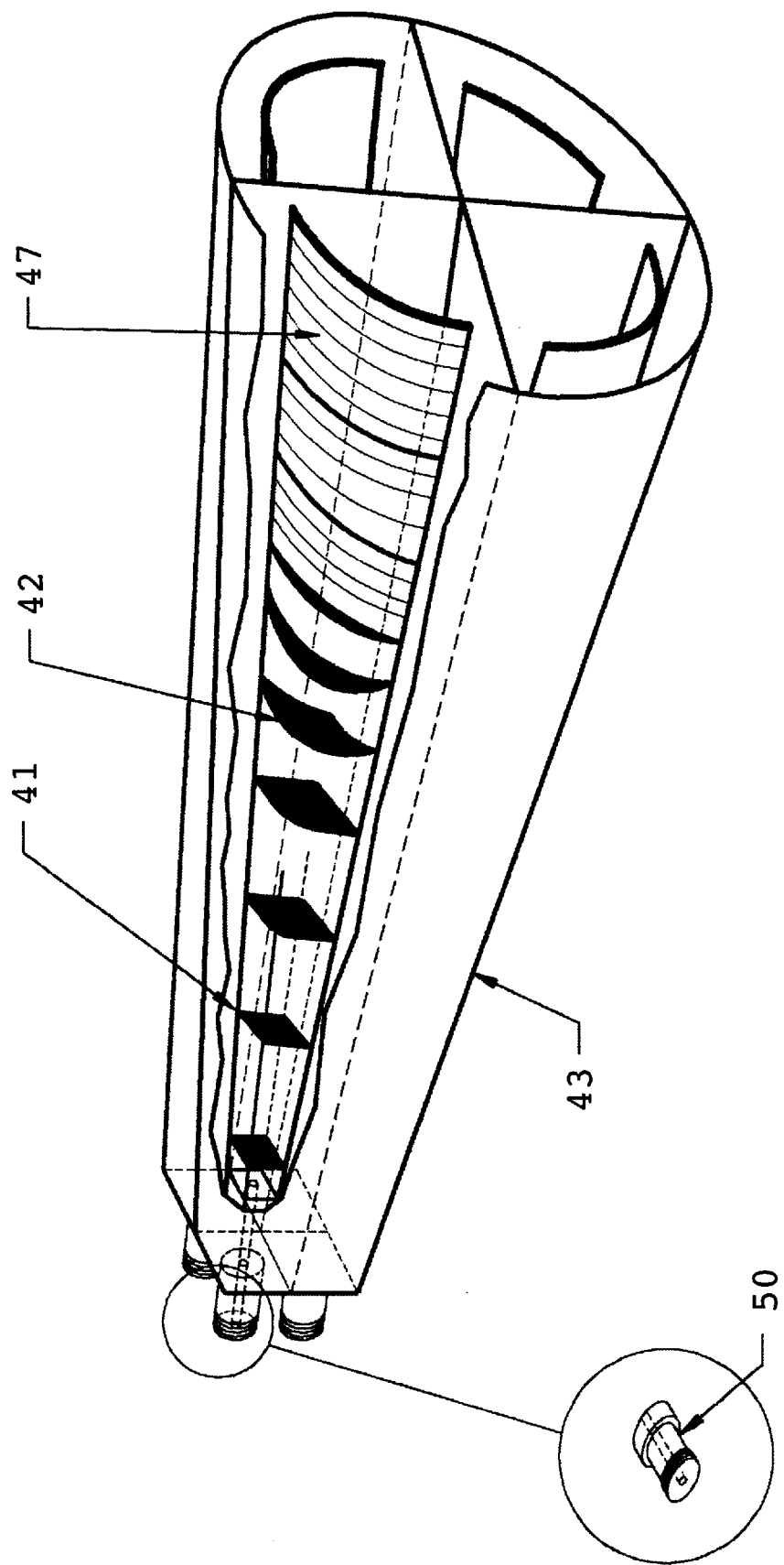

FIG. 4 shows more detail of the signal feed 43 used to connect coaxial lines 50 to the separate quadrants of the primary section 40. The round central pin of each coaxial connector is connected to an elongated element 41. Element 41 has a square cross-section at its junction with the pin and changes in shape along its length through transition shapes 42 (approximately a quadrant of a cone) to merge into the septum of conical sector shape shown at 47. The various cross-sections are shown in black in FIG. 4.

Figure 5:
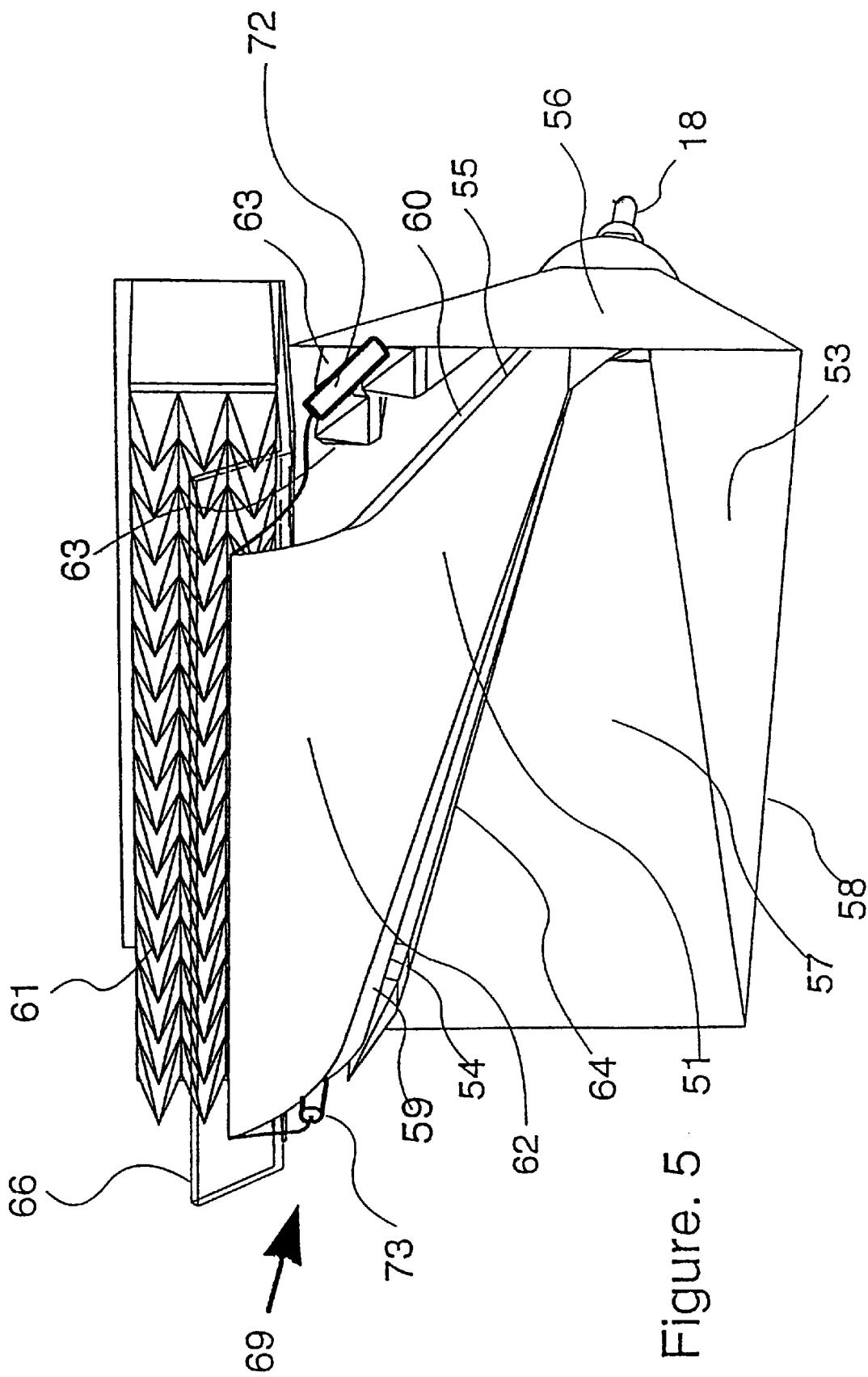
Figure 6:
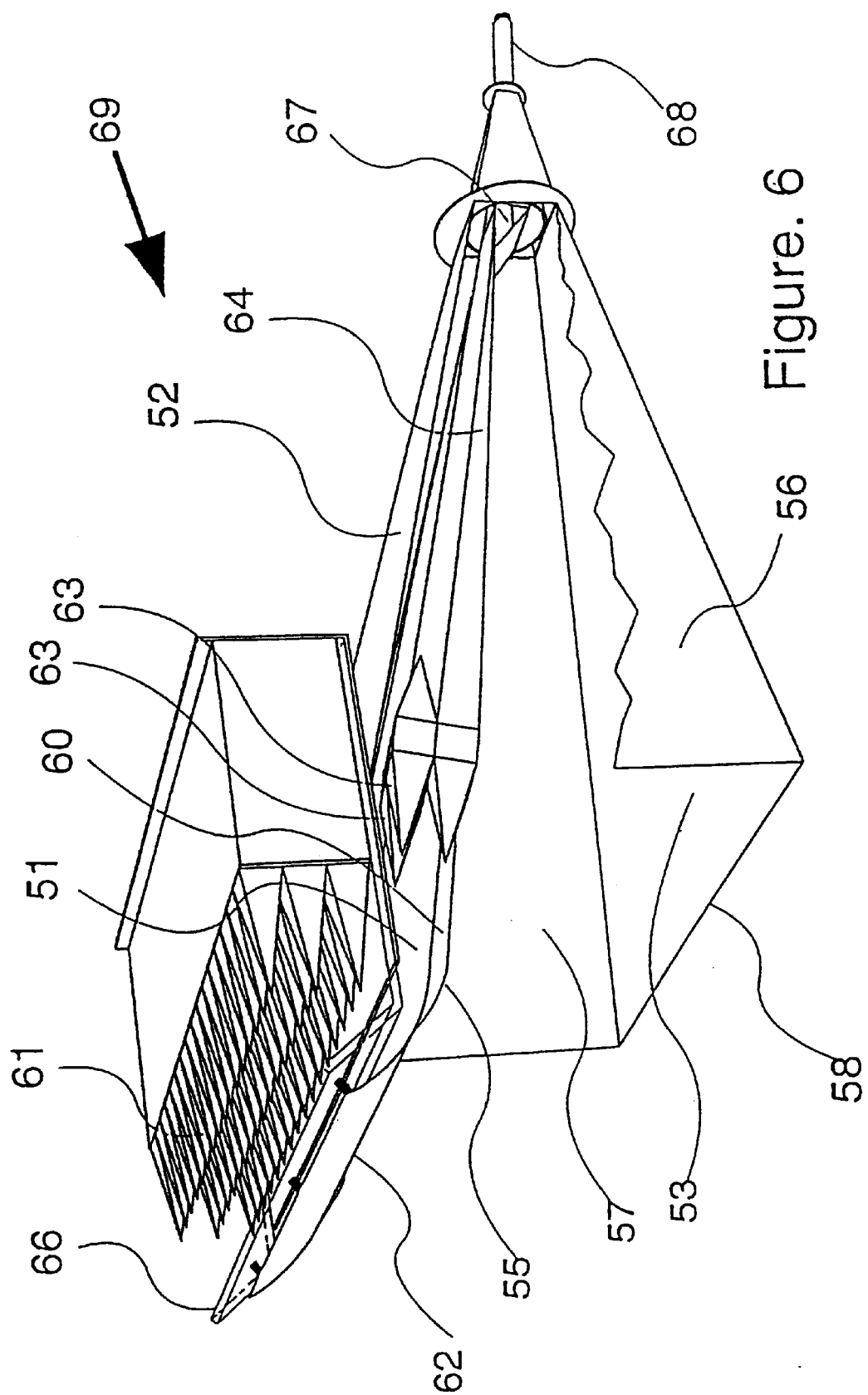
Figure 7:
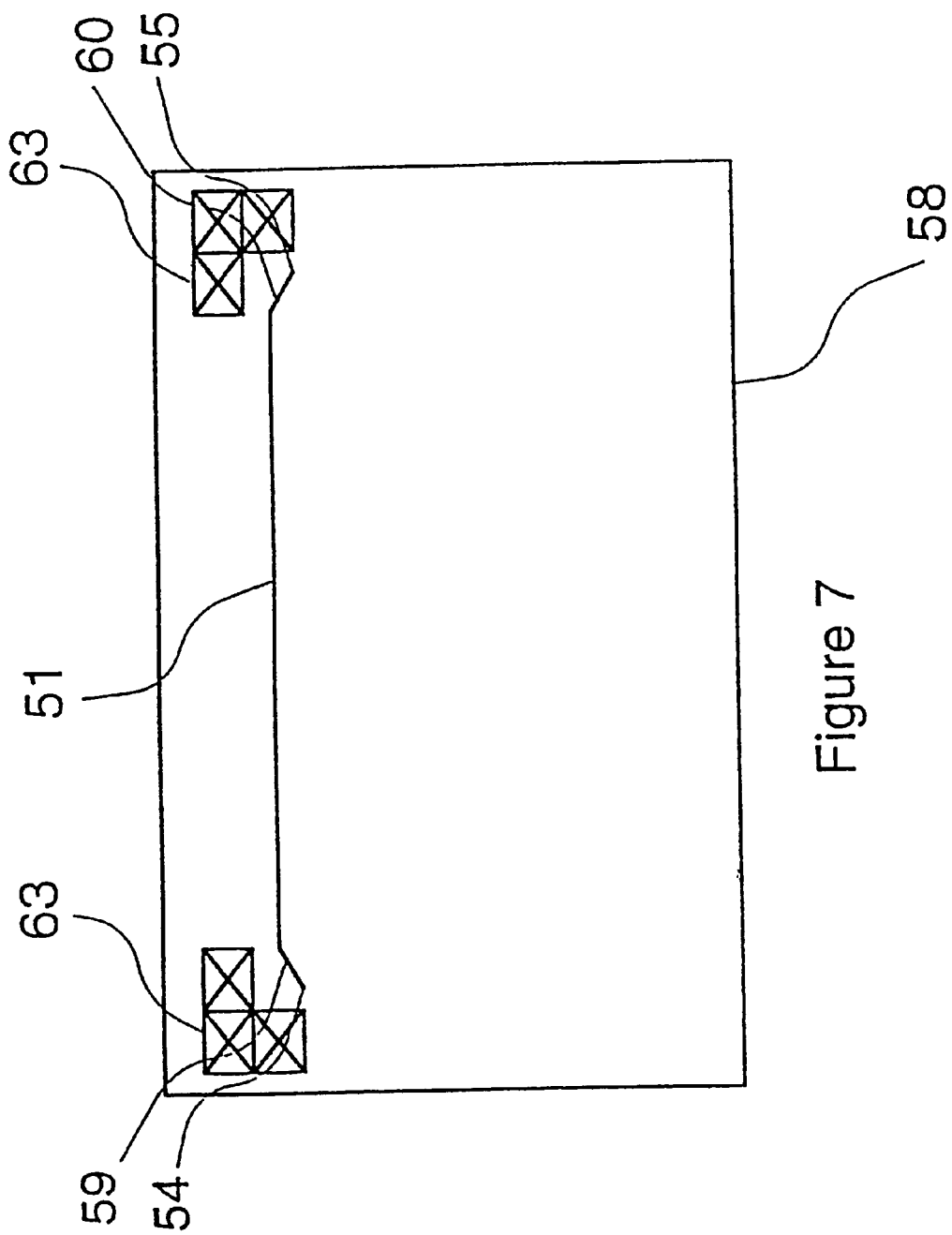
Figure 8:
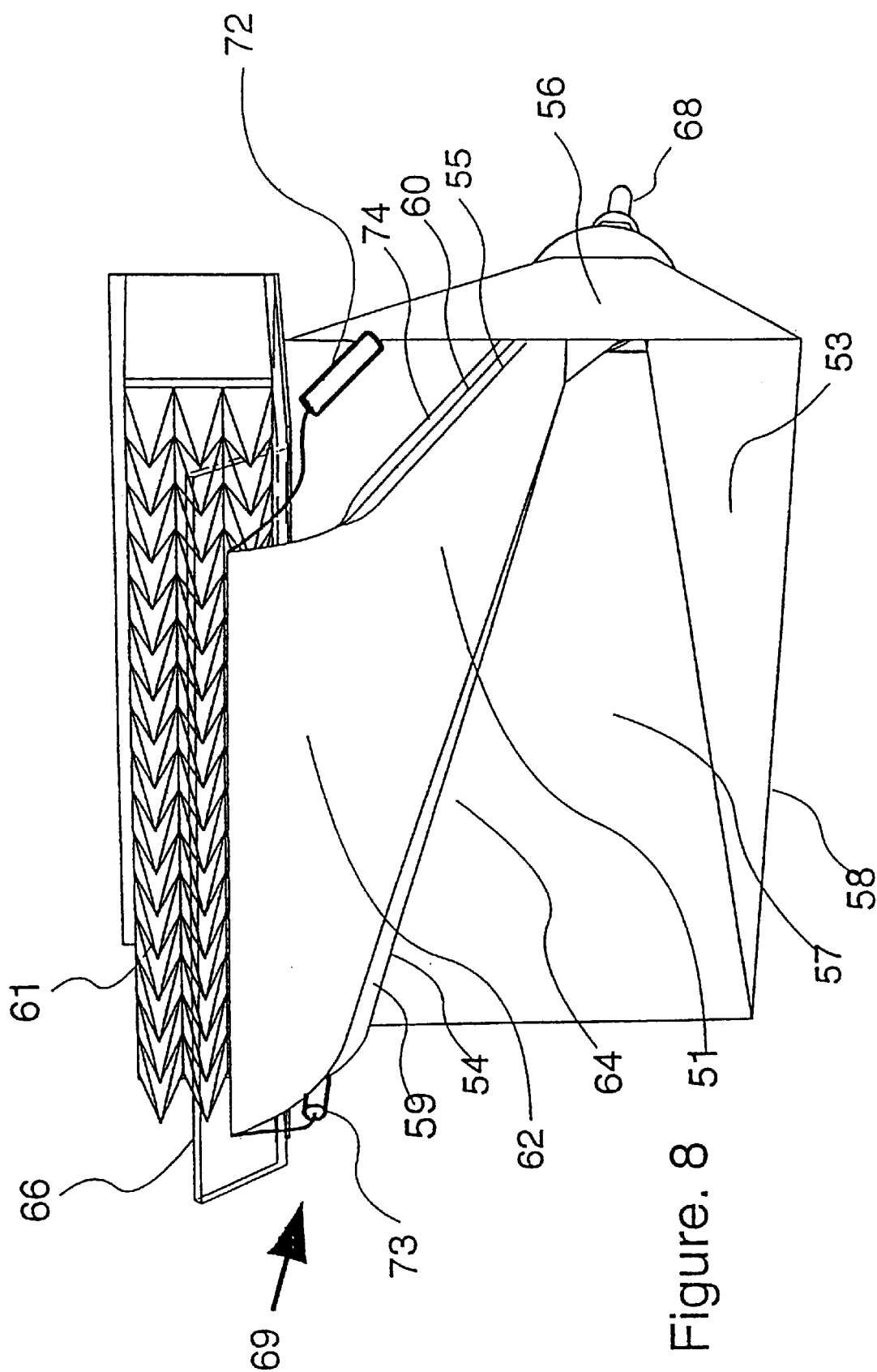
Figure 9:
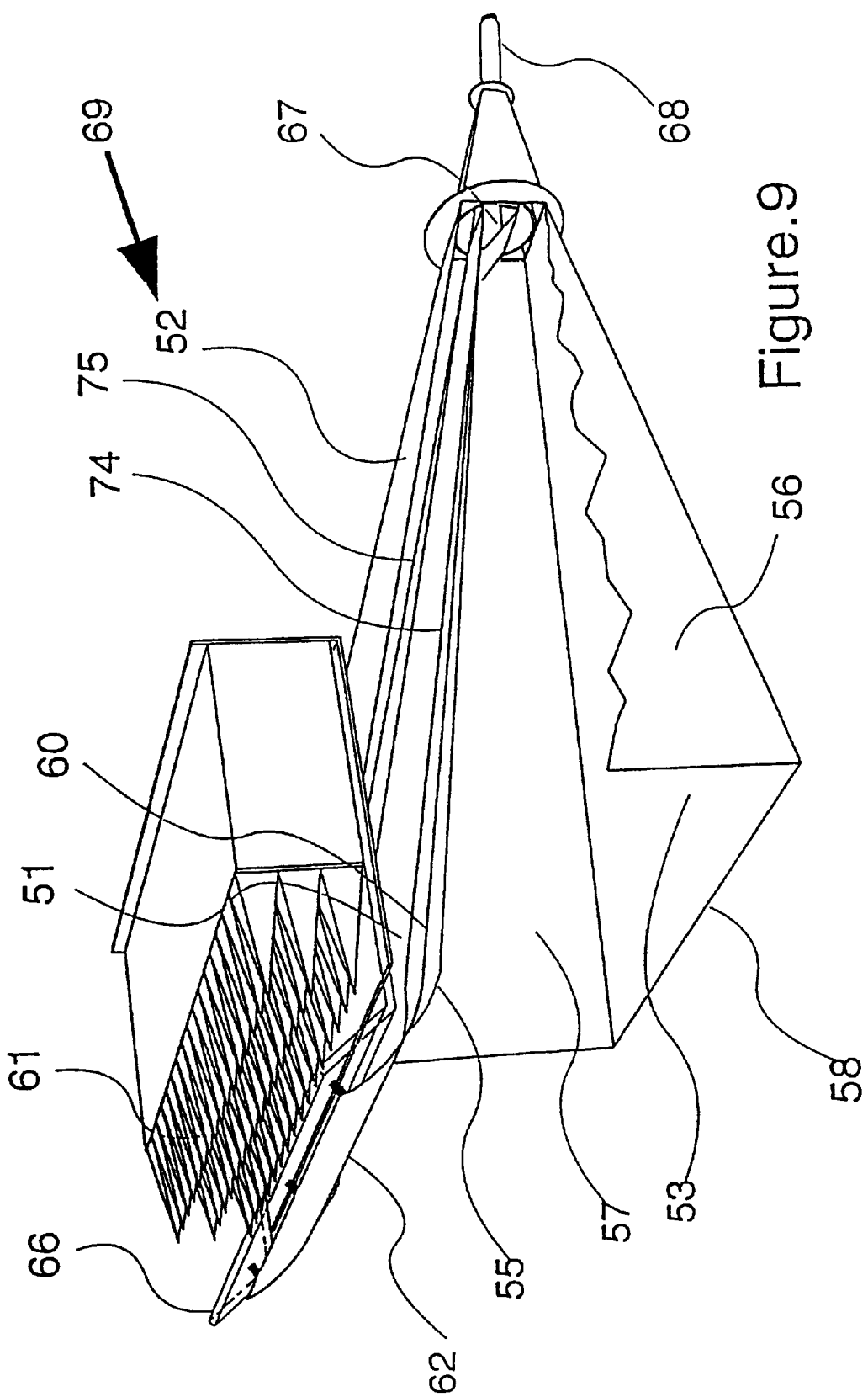
Figure 10:
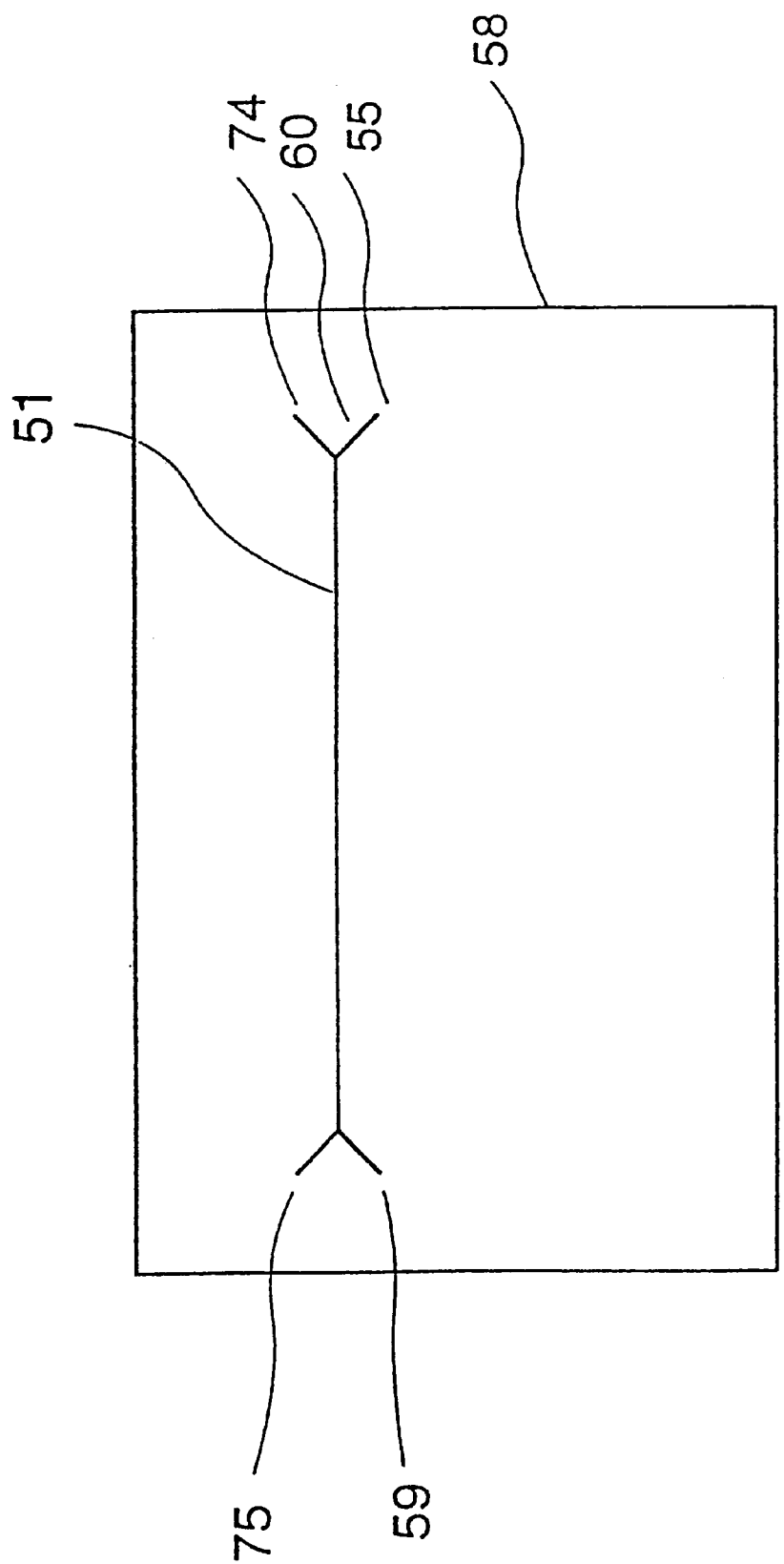

FIG. 5 shows a modified embodiment of the antenna of FIG. 3. In FIG. 5, only one or two segment antennas are used, rather than four as in FIG. 3. In FIG. 5, the septum (51) of the TEM-horn antenna is straight and as such it has to be supported by dielectric supports inside the horn. For frequencies higher than 1 GHz, due to the interference caused by the dielectric support of the septum (51), the field generated by the antenna is not uniform and it can contain null signals. To avoid this condition, the septum (51) is bent (54 and 55), to provide septum rigidity and to allow the septum to be self-supported at its beginning and end—see FIGS. 6 and 7. However, bending of the septum results in distortion of the field in the test area. Such field distortion originates at the edges of the bent septum and it can be eliminated through the addition of absorbing material (63, 64). Addition of the absorbing material (63,64), results in a limitation to the maximum power handling capabilities of the antenna. To avoid this limitation of maximum power, further modification to the antenna is necessary—see FIG. 8. In FIG. 8, the absorbers are removed and the rigidity of the septum (51) is assured through an addition of upper (74 and 75) and lower (55 and 59) bends at the edges of the septum (51)—see FIGS. 9 and 10.

I claim:

1. A compact horn antenna comprising:

two abutting dielectric members, wedge-shaped in side view with unequal wedge angles, the front faces of the dielectric members being curved and cooperating with one another to define a lens surface at the front of the horn;

the side and outer surfaces of the dielectric members being planar with conducting coatings;

a conductor sandwiched between abutting inner surfaces of the dielectric members and spaced from other conducting surfaces to form an insulated septum in the horn;

a first downwardly curved conducting member extending forwardly from the front edge of the lower conducting surface of the horn and a second upwardly curved conducting member extending forwardly from the front edge of the septum, the second conducting member being connected to the front edge of the upper conducting surface of the horn by terminating resistors.

2. An antenna as set out in claim 1 wherein the conductor sandwiched between the dielectric members is part of a circuit board containing active elements coupled to the conductor.

3. An antenna comprising a conducting, conical horn having a primary section adapted to be connected to a signal source and a secondary section;

a pair of conducting partition walls dividing the primary section into four quadrants electrically isolated from one another;

each quadrant of the primary section having an insulated conducting septum formed by a sector of a cone arranged parallel to and spaced from the outer surface of the horn;

each conducting septum extending forwarding into the secondary section and each partition wall extending forwardly into the secondary section, the walls separating from one another and reducing in height;

whereby the partition walls cooperate with the septums to provide field uniformity at the output of the antenna.

4. The antenna of claim 3 further including a coupling between a coaxial line and one quadrant of the conical horn comprising:

a conductive connection between the outer conductor of the coaxial line and the wall of the horn, a conducting member of variable cross-section located inside and spaced from the walls of the horn with its smaller end connected to the center conductor of the feed line and its larger end connect to a septum, the cross-section of the conducting member being rectangular at its smaller end and varying smoothly to be of crescent shape mid-way along its length and arcuate at its larger end, a pair of conducting plates extending forwardly from the larger end of the conducting member and diminishing to define a wedge configuration.

5. The antenna of claim 1, further comprising:

an absorbing array positioned adjacent one edge of the horn mouth, the free end of the septum curving upwardly at the mouth of the horn to terminate in the absorbing array.

6. The antenna of claim 5 wherein the edges of the septum adjacent the side walls of the horn are bent out of the plane of the septum to provide rigidity.

7. The antenna of claim 6 further including absorbing material located adjacent the bent edges of the septum.

8. The antenna of claim 5 wherein the edges of the septum adjacent the side walls of the horn are formed in V configuration, both arms of the V being bent out of the plane of the septum.

9. The antenna of claim 8 further including absorbing material located adjacent the bent edges of the septum.

10. A coupling between a coaxial line and one quadrant of a conical horn comprising:

a conductive connection between the outer conductor of the coaxial line and the wall of the horn, a conducting member of variable cross-section located inside and spaced from the walls of the horn with its smaller end connected to the center conductor of the feed line and its larger end connect to a septum, the cross-section of the conducting member being rectangular at its smaller end and varying smoothly to be of crescent shape mid-way along its length and arcuate at its larger end, a pair of conducting plates extending forwardly from the larger end of the conducting member and diminishing to define a wedge configuration.

11. A horn antenna having a conducting septum within the horn electrically isolated from the walls of the horn and adjacent to and spaced from one wall of the horn, the edges of the septum adjacent the side walls of the horn being bent out of the plane of the septum to provide rigidity, an absorbing array positioned adjacent one edge of the horn mouth, the forward end of the septum curving upwardly at the mouth of the horn to terminate in the absorbing array.

12. An antenna as set out in claim 11 further including absorbing material located adjacent the bent edges of the septum.

13. An antenna set out in claim 11 wherein the edges of the septum adjacent the side walls of the horn are formed in V configuration, both arms of the V being bent out of the plane of the septum.

14. An antenna as set out in claim 13 further including absorbing material located adjacent the bent edges of the septum.

* * * * *